US012336145B2

(12) United States Patent
Loo et al.

(10) Patent No.: US 12,336,145 B2
(45) Date of Patent: Jun. 17, 2025

(54) VAPOR CHAMBER WITH IONIZED FLUID

(71) Applicant: Intel Corporation, Santa Clara, CA (US)

(72) Inventors: Twan Sing Loo, Penang (MY); Jeff Ku, Taipei (TW); Min Suet Lim, Penang (MY); Khai Ern Ke See, Pulau Pinang (MY); Mark Carbone, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 683 days.

(21) Appl. No.: 17/541,663

(22) Filed: Dec. 3, 2021

(65) Prior Publication Data

US 2022/0095484 A1 Mar. 24, 2022

(51) Int. Cl.

| | |
|---|---|
| ***H05K 7/20*** | (2006.01) |
| ***F28F 13/18*** | (2006.01) |
| ***G06F 1/20*** | (2006.01) |

(52) U.S. Cl.

CPC ....... *H05K 7/20327* (2013.01); *F28F 13/182* (2013.01); *G06F 1/20* (2013.01); *H05K 7/20381* (2013.01); *G06F 2200/201* (2013.01)

(58) Field of Classification Search

CPC ........... H05K 7/20309; H05K 7/20336; H05K 7/20772; G06F 2200/201; G06F 1/203; G06F 1/206; G06F 1/20; F28D 15/04; F28D 15/06; F28D 15/02; F28D 15/0233; F28D 2021/0028; F28F 13/06–12; F28F 13/182; H02N 3/00; F15D 1/0075

See application file for complete search history.

(56) References Cited

U.S. PATENT DOCUMENTS

| | | | | |
|---|---|---|---|---|
| 3,682,239 A * | 8/1972 | Abu-Romia | F28D 15/025 310/308 |
| 3,683,214 A * | 8/1972 | Leffert | H02N 3/00 310/10 |
| 4,220,195 A * | 9/1980 | Borgoyn | F28F 13/16 165/104.23 |
| 4,523,112 A * | 6/1985 | Marks | H02N 3/00 310/309 |
| 7,235,164 B2 * | 6/2007 | Anex | F04B 43/043 204/600 |

(Continued)

FOREIGN PATENT DOCUMENTS

| | | |
|---|---|---|
| JP | 2005353887 A | 12/2005 |
| JP | 2007067330 A | 3/2007 |
| JP | 2010147286 A | 7/2010 |

OTHER PUBLICATIONS

PCT/US2022/051048 International Search Report and Written Opinion of the International Searching Authority dated Apr. 4, 2023 (11 pages).

*Primary Examiner* — Lisa Lea-Edmonds

(74) *Attorney, Agent, or Firm* — Banner & Witcoff Ltd.

(57) ABSTRACT

Particular embodiments described herein provide for an electronic device that can be configured to include a vapor chamber that includes ionized fluid and an adjustable polarization layer coupled to the vapor chamber. The adjustable polarization layer can be used to direct a flow of the ionized fluid in the vapor chamber towards one or more heat sources. In some examples, the ionized fluid is ionized water and the adjustable polarization layer is polyester (PET) film that includes a plurality of electrode stripes.

20 Claims, 8 Drawing Sheets

(56) References Cited

U.S. PATENT DOCUMENTS

| | | | | |
|---|---|---|---|---|
| 10,317,962 | B2 * | 6/2019 | Bose | G06F 1/324 |
| 10,698,458 | B2 * | 6/2020 | Delano | F28D 15/0233 |
| 11,036,067 | B2 * | 6/2021 | Skorka | G01J 1/4228 |
| 11,394,227 | B2 * | 7/2022 | Yebka | H01M 50/105 |
| 12,167,571 | B2 * | 12/2024 | Takahashi | B32B 15/01 |
| 12,203,706 | B2 * | 1/2025 | Salamon | F28F 3/12 |
| 12,204,385 | B2 * | 1/2025 | He | G06F 1/206 |
| 2003/0085024 | A1 * | 5/2003 | Santiago | B01D 61/427 257/E23.098 |
| 2012/0180978 | A1 * | 7/2012 | Gavillet | F28F 13/182 216/13 |
| 2015/0346784 | A1 * | 12/2015 | Delano | G06F 1/203 361/679.53 |
| 2019/0186842 | A1 * | 6/2019 | Chiang | C25D 7/00 |
| 2019/0204884 | A1 * | 7/2019 | Bose | G06F 1/3206 |
| 2022/0095484 | A1 * | 3/2022 | Loo | G06F 1/20 |
| 2023/0069684 | A1 * | 3/2023 | Kitamura | H05K 7/2039 |
| 2024/0019914 | A1 * | 1/2024 | Saha | H02M 7/4815 |
| 2024/0079988 | A1 * | 3/2024 | Mills | C01B 3/34 |
| 2024/0147657 | A1 * | 5/2024 | North | H05K 7/20172 |
| 2024/0231447 | A9 * | 7/2024 | He | H05K 7/20336 |

* cited by examiner

VAPOR CHAMBER WITH IONIZED FLUID

TECHNICAL FIELD

This disclosure relates in general to the field of computing and/or device cooling, and more particularly, to a vapor chamber with ionized fluid.

BACKGROUND

Emerging trends in electronic devices are changing the expected performance and form factor of devices as devices and systems are expected to increase performance and function while having a relatively thin profile. However, the increase in performance and/or function causes an increase in the thermal challenges of the devices and systems. Insufficient cooling can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1A:
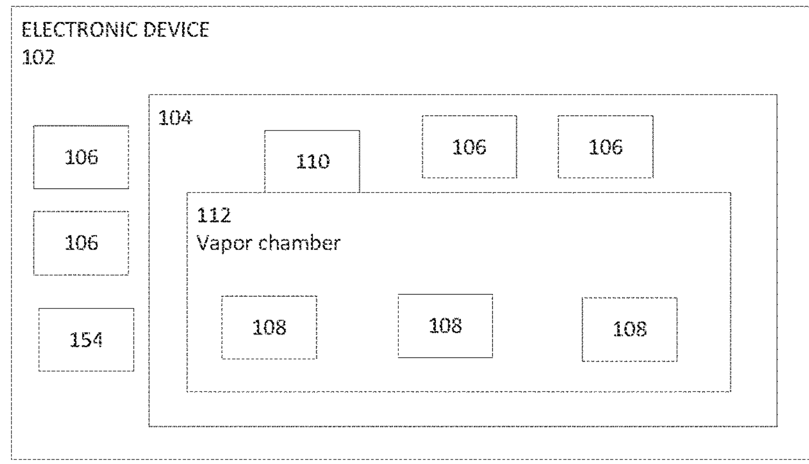
FIG. 1A is a simplified block diagram of a system to enable a vapor chamber with ionized fluid, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a vapor chamber with ionized fluid. Features such as structure(s), function(s), and/or characteristic(s), for example, are described with reference to one embodiment as a matter of convenience; various embodiments may be implemented with any suitable one or more of the described features.

In an example, a vapor chamber can be configured to include ionized fluid. An adjustable polarized layer coupled to the vapor chamber can create one or more biased areas. The one or more biased areas can help control the flow of the ionized fluid in the vapor chamber and can help provide an intentional instructed cooling path to help direct the heat away from a heat source.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer or component disposed over or under another layer or component may be directly in contact with the other layer or component or may have one or more intervening layers or components. Moreover, one layer or component disposed between two layers or components may be directly in contact with the two layers or components or may have one or more intervening layers or components. In contrast, a first layer or first component "directly on" a second layer or second component is in direct contact with that second layer or second component. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

Furthermore, the term "connected" may be used to describe a direct connection between the things that are connected, without any intermediary devices, while the term "coupled" may be used to describe either a direct connection between the things that are connected, or an indirect connection through one or more intermediary devices. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Turning to FIG. 1A, FIG. 1A is a simplified block diagram of an electronic device 102 configured with a vapor chamber with ionized fluid, in accordance with an embodiment of the present disclosure. In an example, the electronic device 102 can include a support structure 104, one or more electronic components 106, and a workload engine 154. The support structure 104 can be a substrate and more particularly, a printed circuit board (PCB). Each of the electronic components 106 can be a device or group of devices available to assist in the operation or function of the electronic device 102. One or more of the electronic components 106, at least one heat source 108, and a polarizing engine 110 can be on or over the support structure 104. A vapor chamber 112 can be over the one or more heat sources 108. Each of the one or more heat sources 108 may be a heat generating device (e.g., processor, logic unit, field programmable gate array (FPGA), chip set, integrated circuit (IC), a graphics processor, graphics card, battery, memory, or some other type of heat generating device). The workload engine 154 can determine a workflow for each of the heat sources 108 and determine if the workflow would cause the temperature of one or more of the heat sources 108 to be above a temperature threshold. In some examples, the workload engine 154 can include a lookup table that includes data related to previous conditions, parameters, workloads, thermal responses, etc. to help determine a workflow for each of the heat sources 108 and if the workflow would cause the temperature of the one or more of the heat sources 108 to be above the temperature threshold. In other examples, the workload engine 154 can use other means to determine if the workflow would cause the temperature of the one or more of the heat sources 108 to be above the temperature threshold. In an example, the temperature threshold can be a temperature that is at or above a maximum operating temperature set by a manufacture of the heat source or above some other predetermined temperature (e.g., about 75% of the maximum operating temperature set by the manufacture) depending on design constraints and user preference.

Figure 1B:
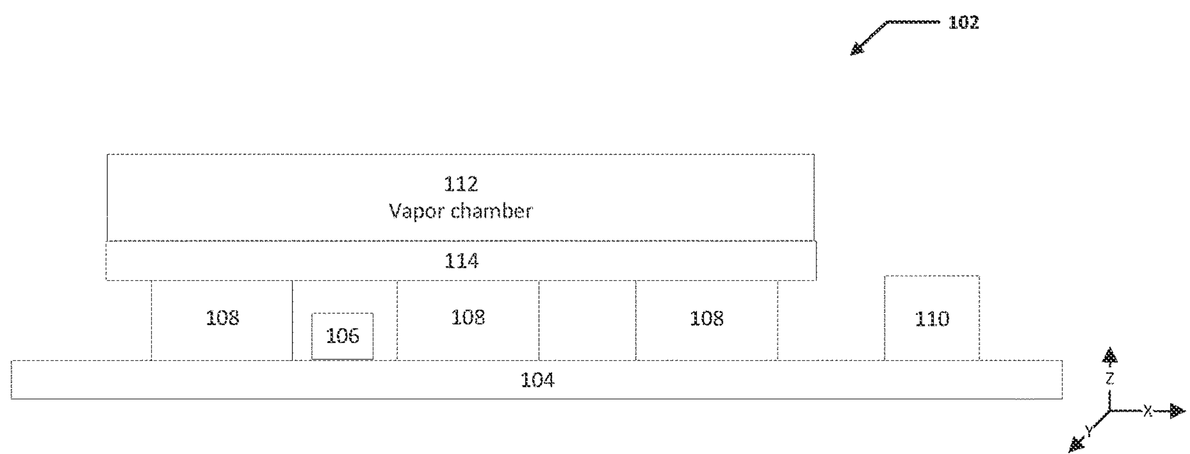
FIG. 1B is a simplified block diagram of a partial side view of system to enable a vapor chamber with ionized fluid, in accordance with an embodiment of the present disclosure.

Turning to FIG. 1B, FIG. 1B is a simplified block diagram of a portion of the electronic device 102 configured with the vapor chamber with ionized fluid. The electronic device 102 can include the support structure 104. One or more of the electronic components 106, the at least one heat source 108, and the polarizing engine 110 can be on or over the support structure 104. The vapor chamber 112 can be over the one or more heat sources 108. An adjustable polarized layer 114 can be between the one or more heat sources 108 and the vapor chamber 112. The polarizing engine 110 is coupled to the adjustable polarized layer 114 and can cause a change of a charge or a change of bias in one or more areas of the adjustable polarized layer 114. More specifically, in an example, the area of the adjustable polarized layer 114 over a specific heat source 108 can change polarity to attract the ionized fluid in the vapor chamber 112 towards the specific heat source or to repel or push away the ionized fluid in the vapor chamber 112 from the specific heat source towards another heat source. The adjustable polarized layer 114 can include electrodes in a polyester (PET) film, a thermoplastic material or film, or some other adjustable polarizing, biasing, or charge induced material.

The vapor chamber 112 is filled with an ionized liquid fluid. Heat from the heat source 108 causes the ionized liquid to vaporize into ionized vapor. The ionized vapor travels away from the heat source 108 and once cooled, the ionized vapor condenses back into the ionized liquid. The polarization of the adjustable polarized layer 114 can help direct the ionized liquid back to the portion of the vapor chamber 112 that is over the heat source 108, thus completing the vapor-liquid flow loop.

The vapor-liquid flow loop allows the vapor chamber 112 to combine the principles of thermal conductivity and phase transition to transfer heat between two interfaces such as a heat source (e.g., heat source 108) and a cold or cool interface (e.g., a cooler environment around the heat source, an air mover or a thin fin array, a cold plate, etc.). The vapor chamber 112 can include an outer wall that contains the ionized fluid in the vapor chamber 112 in a hermetically sealed environment. In some examples, support posts can help provide structural support to the vapor chamber 112.

In an example, at a relatively hot or warm interface of the vapor chamber 112 (e.g., the area where the vapor chamber 112 is proximate to the heat source 108) the ionized fluid in the vapor chamber 112 turns into a vapor by absorbing heat from the heat source 108. The vapor then travels to a relatively cold or cool interface and condenses back into the ionized fluid and releases heat to the cold or cool interface. The ionized fluid then returns to the relatively hot or warm interface proximate to the heat source 108 and the cycle repeats.

The vapor chamber 108 has a mixture of liquid and vapor in the hermetically sealed environment and has a maximum amount of heat transfer defined as Qmax. The Qmax of a vapor chamber varies widely based on heat source location, overall vapor chamber size, influences from gravity or other forces, etc. In an illustrative example where the heat source 108 under the vapor chamber 112 switches from a steady operation at a low power to a power above the Qmax of the vapor chamber 112, the rate of vaporization will exceed the liquid return rate, which is capped by the capillary limit centrifugal force, gravity, etc. This difference in the two rates will deplete the liquid in the vapor chamber 112 near the heat source 108 and reduce the cooling of the heat source 108. The polarization of the adjustable polarized layer 114 can help direct the ionized liquid back to the portion of the vapor chamber 112 that is over the heat source 108.

In addition, if the heat source 108 is a processor, the system can allow for increases in the clock frequency of the processor greater than the Qmax of the vapor chamber 112 for extended durations. The vapor chamber 112 can help allow the system to operate at a power above the Qmax of the vapor chamber 112 when the system increases the clock frequency of the processor by directing the ionized fluid in the vapor chamber 112 towards the heat source 108. A processor's clock frequency represents how many cycles per second the processor can execute. The higher the clock frequency of the processor, the more "switching" can be done per time-unit by the processor. To increase the clock frequency of the processor, the voltage to the processor is increased. As the voltage increases, so does the power and the amount of heat that is generated by the heat source. The clock frequency is also referred to as clock speed, clock rate, PC frequency, and CPU frequency, and other similar terms. It should be noted that while the the adjustable polarized layer 114 is described as being used with a vapor chamber, in some examples the adjustable polarized layer 114 could be used with a heat pipe to help increase the flow rate of the working fluid towards one or more heat sources. However, because the flow of the working fluid in a heat pipe is generally in one direction, the flow of the working fluid would need to be in a wavelike manner towards the heat source 108.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

It is to be understood that other embodiments may be utilized and structural changes may be made without departing from the scope of the present disclosure. Substantial flexibility is provided in that any suitable arrangements and configuration may be provided without departing from the teachings of the present disclosure.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance and form factor of devices as devices and systems are expected to increase performance and function while having a relatively thin profile. However, the increase in performance and/or function causes an increase in the thermal challenges of the devices and systems. For example, in some devices, it can be difficult to cool a particular heat source. One way to cool a heat source is to use a heat pipe or vapor chamber.

Heat pipes and vapor chambers are heat-transfer devices that combine the principles of both thermal conductivity and phase transition to transfer heat between two interfaces (e.g., a heat source and a cold or cool interface such as a heatsink). At the hot interface of a heat pipe or vapor chamber (e.g., the portion of the heat pipe or vapor chamber near the heat source), a liquid in contact with a thermally conductive solid surface near the heat source turns into a vapor by absorbing heat from the heat source. The vapor then travels along the heat pipe or through the vapor chamber to the cold or cool interface and condenses back into a liquid, releasing the collected heat. The liquid then returns to the hot interface through either capillary action, centrifugal force, or gravity and the cycle repeats.

A typical heat pipe or vapor chamber consists of a sealed pipe or tube made of a material that is compatible with a working fluid (e.g., copper for water heat pipes or aluminum for ammonia heat pipes). During construction of the heat pipe or vapor chamber, a vacuum pump is typically used to remove the air from an empty heat pipe or vapor chamber. The heat pipe or vapor chamber is partially filled with the working fluid and then sealed. The working fluid mass is chosen such that the heat pipe or vapor chamber contains both vapor and liquid over a desired operating temperature range. Below the operating temperature, the liquid is cold and cannot vaporize into a gas. Above the operating temperature, all the liquid has turned to gas, and the environmental temperature is too high for any of the gas to condense. Thermal conduction is still possible through the walls of the heat pipe or vapor chamber but at a greatly reduced rate of thermal transfer.

Working fluids are chosen according to the temperatures at which the heat pipe or vapor chamber will operate. For example, at extremely low temperature applications, (e.g., about 2-4 K) liquid helium may be used as the working fluid and for extremely high temperatures, mercury (e.g., about 523-923 K), sodium (e.g., about 873-1473 K), or indium (e.g., about 2000-3000 K) may be used as the working fluid. The vast majority of heat pipes or vapor chambers for room temperature applications use water (e.g., about 298-573 K), ammonia (e.g., about 213-373 K), or alcohol (e.g., methanol (e.g., about 283-403 K) or ethanol (e.g., about 273-403 K)) as the fluid. Copper/water heat pipes or vapor chambers have a copper envelope, use water as the working fluid and typically operate in the temperature range of about twenty degrees Celsius (20° C.) to about one-hundred and fifty degrees Celsius (150° C.). Water heat pipes or vapor chamber are sometimes filled by partially filling the heat pipe or vapor chamber with water, heating until the water boils and displaces the air, and then sealing the heat pipe or vapor chamber while hot.

Heat pipes and vapor chambers are ubiquitous in current mobile thermal solutions, however, the maximum cooling capacity (Qmax) is still limited, particularly in the thin, aggressive form factors. In some systems, the real workload is bursty where the clock frequency of the processor is frequently increased and the system includes high dynamic range silicon to maximize performance and user experience. However, the power supported by the heat pipe or vapor chamber is limited due to the Qmax of the heat pipe or vapor chamber, and hence limits the maximum power of the system. Currently, thermal solutions are chosen such that the combined power limit of multiple heat pipes in the thermal solution exceeds the power used during increases in the clock frequency of the processor. This is typically achieved by having a relatively large number of heat pipes (e.g., two or more), using relatively large and relatively thick heat pipes, and/or reducing the clock frequency of the processor. None of those options are appealing to the user because most users want a thin device without compromising the system's performance. Vapor chambers are more efficient at spreading heat over a larger X-Y plane as compared to multiple heat pipes. The vapor chamber can more effectively collect heat from a heat source as compared to a heat pipe or multiple heat pipes that are side by side and the vapor chamber is not limited to a single path to transfer the collected heat from the heat source to cooler regions.

More specifically, unlike a heat pipe that works in one dimension to transfer heat from a heat source to a fan heat exchange, the vapor chamber works as a two-dimensional heat spreader to distribute the heat from a heat source to a larger area (as compared to the area of a heat pipe) in a planar heat transfer direction. The larger area helps to allow the vapor chamber to spread the heat uniformly away from heat source as compared to a heat pipe.

With higher demand in performance, some systems, and more particularly processors, require a better heat solution than can be provided by a heat pipe. Vapor chambers are often designed to be large and extend to cover a large area. However, this increases the overall system Z-height, yielding a thicker system. A thicker vapor chamber with an increased Z-height requires an isolation layer and larger room within the device for the air flow to circulate and also results in an increase in the system Z-height. In addition, a vapor chamber with the natural capillary process results in an in-efficient heat transfer and can result in the vapor chamber being unable to spread collected heat fast enough to dissipate the collected heat, especially during increases in the clock frequency of the processor. What is needed is a system to enable a vapor chamber with ionized fluid.

A system to enable vapor chamber with ionized fluid, as outlined in FIG. 1, can resolve these issues (and others). In an example, a vapor chamber (e.g., the vapor chamber 112) can be configured to include ionized fluid (e.g., ionized water) that replaces the fluid (e.g., purified water) in current vapor chambers. The ionized fluid in the vapor chamber can help provide an intentional instructed cooling path to help direct the heat away from a heat source more efficiently and faster relative to a heat pipe and some current vapor chambers.

In an illustrative example, the ionized fluid is ionized water. The ionized water is used to replace the purified water often used in current vapor chambers. The ionized water includes two hydrogen atoms and one oxygen atom, with the two hydrogen atoms having a positive charge. In the ionized water's liquid form, these atoms are free to move around and can be relatively easily affected by a static electrical charge.

One way to create the electrical charge to control the flow of the ionized fluid is with electrodes. For example, the electrodes can charge a portion of the vapor chamber with an applied voltage to create a bias that attracts or repels the ionized fluid and indirectly creates an intentional directional path of heat transfer for relatively efficient and relatively faster heat dissipation from relatively hot components to cooler regions as compared to current designs. In an example, the electrodes can be in a PET film, a thermoplastic material or film, or some other adjustable polarizing, biasing, or charge induced material. In a specific example, multiple electrode stripes can be designed on a PET film (thickness=0.2 mm) by using laser direct structuring (LDS) technology. The PET film adheres to the surface of the vapor chamber and can be caused to apply a high voltage or a low voltage according to the heat path needed. The electrodes stripes can be tied to adjustable low/high voltages/bias according to different cooling needs per varied workloads. In some examples, a grid or array of electrodes can be used to help direct the flow of the ionized fluid. In other examples, concentric circles of electrodes can be used to help direct the flow of the ionized fluid. The concentric circles of electrodes can be driven by a circuit that energized them in sequence from outside to inside, pushing the ionized fluid towards the heat source.

Vapor chambers typically reach their limit (Qmax) because the working fluid is not brought back to the heat input area the evaporator region fast enough. Better wick material can help with the issue of returning the working fluid to the heat input area but there is a limit of the wick material to control the flow of the working fluid. By the controlling the flow of the ionized fluid with electrodes, the system does not rely only on the capillary action of working fluid in the wick.

In an example, the flow of the ionized fluid can be controlled with a PET circuit. Multiple electrode stripes can be designed on a PET film to create the PET circuit. The PET circuit, a PET film with electrode strip(s), adheres on the external surface of vapor chamber and a current flow in the PET circuit will create an electromagnetic field. The electric field will not transmit through the vapor chamber wall, especially a copper vapor chamber wall, but the magnetic field will go through the vapor chamber wall, especially if the vapor chamber wall is comprised of copper as copper has the same magnetic field permeability as free pace. Further, Faraday's Law states that a constant magnetic field will not exert a force on a stationary charged particle, only on a moving charged particle.

A circuit can be used to drive the PET circuit such that the magnetic field is time varying. This effectively causes the magnetic field to 'move' with respect to the ions in the ionized working fluid. The current flow pattern used can create magnetic field lines that push the working fluid ions in a desired direction, as the force on the ions is perpendicular to the magnetic field lines. With an x,y conductor grid and the PET circuit, a changing magnetic field can be generated to apply the force on the ions in the required direction. Also, a general x,y conductor grid can allow for different applications simply by changing the magnetic field circuit so the expanding and collapsing magnetic field is properly directed. In an example, the ionized working fluid is ionized water. The ionized water can be made without adding minerals to the water.

By controlling the current path through the external conductor layers of the PET circuit, the shape of the magnetic field is tailored so the ionized fluid will be driven back to the evaporator. One example field geometry to drive the ions is the have the field move inwards, nudging the ions in a specific or desired direction every time the shrinking-circular magnetic field moves over it. This can also be described as ripples in the field, with constant wave crests moving over the ions to push them in the specific or desired direction. The circuit of the flow of ions is completed when the liquid evaporates from the hot spot neat the heat source and travels to the cooler areas of the vapor chamber as vapor. A circuit controller can sequence the electromagnetic field to change over time to force the liquid in the specific or desired direction. It should be noted that while the PET circuit is described as being used with a vapor chamber, in some examples the PET circuit could be used with a heat pipe to help increase the flow rate of the working fluid towards one or more heat sources. However, because the flow of the working fluid in a heat pipe is generally in one direction, the flow of the working fluid would need to be in a wavelike manner towards the heat source.

In an example implementation, the electronic device 102, is meant to encompass a computer, a personal digital assistant (PDA), a laptop or electronic notebook, a cellular telephone, an iPhone, a tablet, an IP phone, network elements, network appliances, servers, routers, switches, gateways, bridges, load balancers, processors, modules, or any other device, component, element, or object that includes a heat source and a vapor chamber. The electronic device 102 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. The electronic device 102 may include virtual elements.

In regards to the internal structure, the electronic device 102 can include memory elements for storing information to be used in operations. The electronic device 102 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations described herein. This includes the memory elements being able to store software, logic, code, or processor instructions that are executed to carry out activities or operations.

Additionally, the heat source 108 may be or include one or more processors that can execute software or an algorithm. In one example, the processors can transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2A:
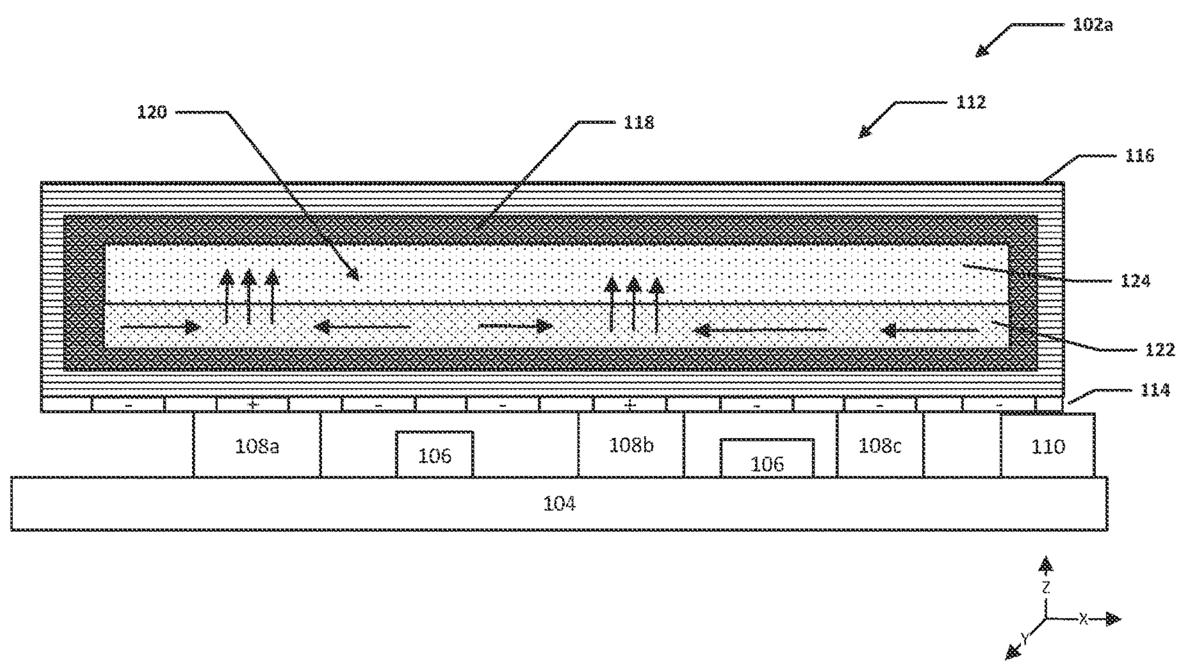
FIGS. 2A and 2B are a simplified block diagram of a partial side view of a system to enable a vapor chamber with ionized fluid, in accordance with an embodiment of the present disclosure.

Turning to FIG. 2A, FIG. 2A is a simplified block diagram of a portion of an electronic device 102*a*, in accordance with an embodiment of the present disclosure. In an example, the electronic device 102*a* can include the support structure 104. The electronic components 106, the one or more heat sources 108, and the polarizing engine 110 can be over the support structure 104. For example, FIG. 2A illustrates the heat sources 108*a*-108*c* over the support structure 104.

The vapor chamber 112 can be over the heat sources 108*a*-108*c* with the adjustable polarized layer 114 between the heat sources 108*a*-108*c* and the vapor chamber 112. In an example, the adjustable polarized layer 114 can have a thickness between about 0.1 millimeters and about 0.5 millimeters and ranges therein (e.g., between about 0.15 and about 0.3 millimeters, or between about 0.2 and about 0.4 millimeters), depending on design choice and design constraints. In other examples, the adjustable polarized layer 114 can have a thickness depending on design choice and design constraints. In a specific example, the adjustable polarized layer 114 can have a thickness that is less than or equal to about 0.3 millimeters. In another specific example, the adjustable polarized layer 114 can have a thickness that is greater than or equal to about 0.1 millimeters. In another specific example, the adjustable polarized layer 114 can have a thickness that is about 0.2 millimeters.

The vapor chamber 112 can include an outside wall 116, wick material 118, and ionized fluid 120. The ionized fluid 120 is the working fluid of the vapor chamber 112 and can be in a liquid form as an ionized liquid 122 or in a vapor form as an ionized vapor 124. The ionized fluid can be a fluid that includes ions (e.g., ionized water) or some other fluid that includes ions and has a liquid state and a vapor state. If the ionized fluid 120 is ionized water and the vapor chamber 112 includes copper, free oxygen can be removed from the ionized water to help protect against copper corrosion from hydroxide ions.

The outside wall 116 can provide the structure and support for the vapor chamber 112. The wick material 118 can be a porous material that allows the ionized liquid 122 to flow or move in the vapor chamber 112. The wick material 118 can be comprised of sintered powder, metal sintered fibers, screen mesh, grooved or machined walls of the vapor chamber 112, metal foam, pins/pillars, or some other material that can allow the ionized liquid 122 (e.g., the condensed liquid phase of the working fluid) to flow or be distributed (e.g., from capillary action) from a relatively cooler area of the vapor chamber 112 to a relatively hotter area of the vapor chamber 112 (e.g., near the heat source 108*a*).

The adjustable polarized layer 114 can be secured to the bottom outside wall 116 of the vapor chamber 112 (e.g., the bottom portion of the vapor chamber 112). The polarizing engine 110 can control what areas of the adjustable polarized layer 114 are biased positive (have a positive biased) and what areas of the adjustable polarized layer 114 are biased negative (have a negative bias). For example, as illustrated in FIG. 2A, the polarizing engine 110 can cause an area of the adjustable polarized layer 114 over the heat sources 108*a* and 108*b* to be biased positive while other areas of the adjustable polarized layer 114 are biased negative. The positive areas of the adjustable polarized layer 114 attract or pull the ionized liquid 122 in the vapor chamber 112 towards the heat sources 108*a* and 108*b* and the negative areas of the adjustable polarized layer 114 repel or push the ionized liquid 122 in the vapor chamber 112 towards the heat sources 108*a* and 108*b*. By causing the ionized liquid 122 in the vapor chamber 112 to flow towards the heat sources 108*a* and 108*b*, the time to dry out of the vapor chamber 112 can be increased and/or if the heat source 108*a* or 108*b* are processors, the amount of time that can be spent using an increased clock frequency of the processors can be increased.

More specifically, the vapor chamber 112 is filled with the ionized liquid 122 and the ionized vapor 124. Heat from the heat sources 108*a*-108*c* causes the ionized liquid 122 to vaporize into the ionized vapor 124. The ionized vapor 124 travels to the cold or cool portion of the vapor chamber 112 and condenses into the ionized liquid 122 and releases the heat collected from the heat sources 108*a*-108*c*. The capillary force in the wick material 118 pulls the ionized liquid 122 back to the portion of the vapor chamber 112 over the heat sources 108*a*-108*c*, thus completing the vapor/liquid flow loop. There is a maximum capillary pressure the wick material 118 can provide, defined by its porous structure. The presence of the maximum capillary pressure limits the amount of liquid that can be pulled from the relatively cold or cool portion of the vapor chamber 112 to the area of the vapor chamber 112 over the heat sources 108*a* and 108*b*. The power at which the rate of vaporization matches this maximum liquid flow rate is defined as Qmax for the vapor chamber 112. By adjusting the polarity of the adjustable polarized layer 114 to control the flow of the ionized fluid 120, the vapor chamber can sustain a high-power burst at powers greater than the Qmax of the vapor chamber 112 without drying out during the burst period.

Figure 2B:
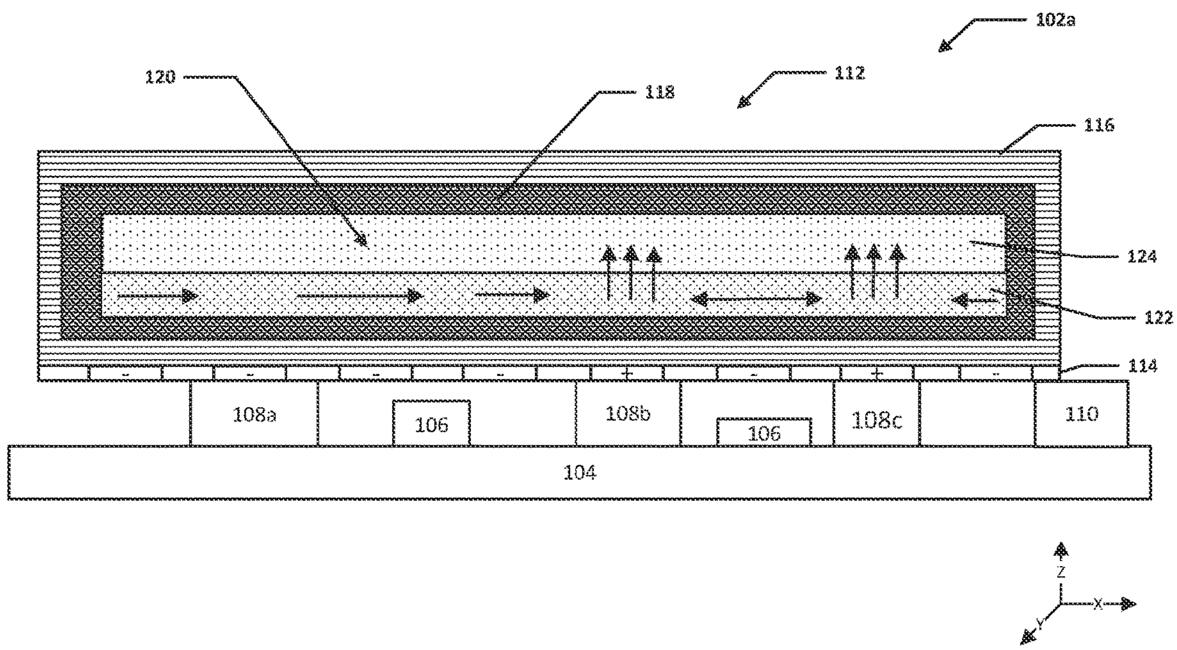

Turning to FIG. 2B, FIG. 2B is a simplified block diagram of a portion of the electronic device 102*a*, in accordance with an embodiment of the present disclosure. In an example, the electronic device 102*a* can include the support structure 104. The electronic components 106, the one or more heat sources 108, and the polarizing engine 110 can be over the support structure 104.

For example, as illustrated in FIG. 2B, the vapor chamber 112 can be over the heat sources 108*a*-108*c* with the adjustable polarized layer 114 between the heat sources 108*a*-108*c* and the vapor chamber 112. The vapor chamber 112 can include the outside wall 116, the wick material 118, and the ionized fluid 120. The ionized fluid 120 is the working fluid of the vapor chamber 112 and can be in a liquid form as the ionized liquid 122 or in a vapor form as the ionized vapor 124.

The adjustable polarized layer 114 can be secured to the bottom outside wall 116 of the vapor chamber 112. The polarizing engine 110 can control what areas of the adjustable polarized layer 114 are biased positive and what areas of the adjustable polarized layer 114 are biased negative. For example, as illustrated in FIG. 2B, the polarizing engine 110 can cause an area of the adjustable polarized layer 114 over the heat sources 108*b* and 108*c* to be biased positive while other areas of the adjustable polarized layer 114 are biased negative. The positive areas of the adjustable polarized layer 114 attract or pull the ionized liquid 122 in the vapor chamber 112 towards the heat sources 108*b* and 108*c* and the negative areas of the adjustable polarized layer 114 repel or push the ionized liquid 122 in the vapor chamber 112 towards the heat sources 108*b* and 108*c*. By causing the ionized liquid 122 in the vapor chamber 112 to flow towards the heat sources 108*b* and 108*c*, the time to dry out of the vapor chamber 112 can be increased and/or if the heat source 108*c* is a processor, the amount of time that can be spent using an increased clock frequency of the processor can be increased.

For example, a first workload may cause the heat source 108*a* to consume more power than heat source 108*c* and, as illustrated in FIG. 2A, the area of the adjustable polarized layer 114 over the heat source 108*a* can be biased positive to attract or pull the ionized liquid 122 in the vapor chamber 112 towards the heat source 108*a* and help provide additional cooling in the area around the heat source 108*a*. In another example, a second workload may cause the heat source 108*c* to consume more power than heat source 108*a* and, as illustrated in FIG. 2B, the area of the adjustable polarized layer 114 over the heat source 108*c* can be biased positive to attract or pull the ionized liquid 122 in the vapor chamber 112 towards the heat source 108*c* and help provide additional cooling in the area around the heat source 108*c*.

More specifically, the vapor chamber 112 is filled with the ionized liquid 122 and the ionized vapor 124. Heat from the heat sources 108*a*-108*c* causes the ionized liquid 122 to vaporize into the ionized vapor 124. The ionized vapor 124 travels to the cold or cool portion of the vapor chamber 112 and condenses into the ionized liquid 122 and releases the heat collected from the heat sources 108*a*-108*c*. The capillary force in the wick material 118 pulls the ionized liquid 122 back to the portion of the vapor chamber 112 over the heat sources 108*a*-108*c*, thus completing the vapor/liquid flow loop. There is a maximum capillary pressure the wick material 118 can provide, defined by its porous structure. The presence of the maximum capillary pressure limits the amount of liquid that can be pulled from the relatively cold or cool area of the vapor chamber 112 to the area of the vapor chamber 112 over the heat sources 108*b* and 108*c*. The power at which the rate of vaporization matches this maximum liquid flow rate is defined as Qmax for the vapor chamber 112. By adjusting the polarity of the adjustable polarized layer 114 to control the flow of the ionized fluid 120, the vapor chamber can sustain a high-power burst at powers greater than the Qmax of the vapor chamber 112 without drying out during the burst period.

Figure 3:
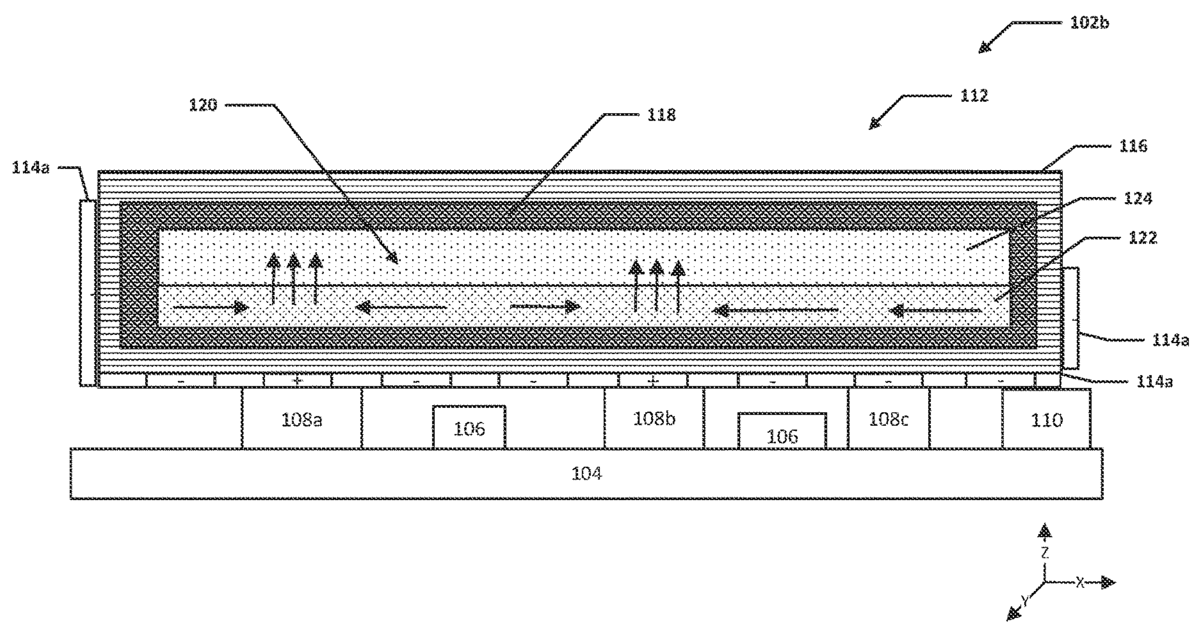
FIG. 3 is a simplified block diagram of a partial side view of a system to enable a vapor chamber with ionized fluid, in accordance with an embodiment of the present disclosure.

Turning to FIG. 3, FIG. 3 is a simplified block diagram of a portion of an electronic device 102*b*, in accordance with an embodiment of the present disclosure. In an example, the electronic device 102*b* can include the support structure 104. The electronic components 106, the one or more heat sources 108, and the polarizing engine 110 can be over the support structure 104.

The vapor chamber 112 can be over the heat sources 108*a*-108*c* with an adjustable polarized layer 114*a* between the heat sources 108*a*-108*c* and the vapor chamber 112 and along one or more sides of the vapor chamber 112. In an example, the adjustable polarized layer 114*a* can have a thickness between about 0.1 millimeters and about 0.5 millimeters and ranges therein (e.g., between about 0.15 and about 0.3 millimeters, or between about 0.2 and about 0.4 millimeters), depending on design choice and design constraints. In other examples, the adjustable polarized layer 114*a* can have a thickness depending on design choice and design constraints. In a specific example, the adjustable polarized layer 114*a* can have a thickness that is less than or equal to about 0.3 millimeters. In another specific example, the adjustable polarized layer 114*a* can have a thickness that is greater than or equal to about 0.1 millimeters. In another specific example, the adjustable polarized layer 114*a* can have a thickness that is about 0.2 millimeters. The vapor chamber 112 can include the outside wall 116, the wick material 118, and the ionized fluid 120. The ionized fluid 120 is the working fluid of the vapor chamber 112 and can be in a liquid form as the ionized liquid 122 or in a vapor form as the ionized vapor 124.

The adjustable polarized layer 114*a* can be secured to one or more surfaces of the outside wall 116 of the vapor chamber 112. The polarizing engine 110 can control what areas of the adjustable polarized layer 114*a* are biased positive and what areas of the adjustable polarized layer 114*a* are biased negative. For example, as illustrated in FIG. 3, the polarizing engine 110 can cause an area of the adjustable polarized layer 114*a* over the heat sources 108*a* and 108*b* to be biased positive while other areas of the adjustable polarized layer 114*a* are biased negative. The positive areas of the adjustable polarized layer 114*a* attract or pull the ionized liquid 122 in the vapor chamber 112 towards the heat sources 108*a* and 108*b* and the negative areas of the adjustable polarized layer 114*a* repel or push the ionized liquid 122 in the vapor chamber 112 towards the heat sources 108*a* and 108*b*. By causing the ionized liquid 122 in the vapor chamber 112 to flow towards the heat sources 108*a* and 108*b*, the time to dry out of the vapor chamber 112 can be increased and/or if a specific heat source is a processor, the amount of time that can be spent using an increased clock frequency of the processor can be increased.

More specifically, the vapor chamber 112 is filled with the ionized liquid 122 and the ionized vapor 124. Heat from the heat sources 108*a*-108*c* causes the ionized liquid 122 to vaporize into the ionized vapor 124. The ionized vapor 124 travels to the relatively cold or cool portion of the vapor chamber 112 and condenses into the ionized liquid 122 and releases the heat collected from the heat sources 108*a*-108*c*. The capillary force in the wick material 118 pulls the ionized liquid 122 back to the portion of the vapor chamber 112 over the heat sources 108*a*-108*c*, thus completing the vapor/liquid flow loop. There is a maximum capillary pressure the wick material 118 can provide, defined by its porous structure. The presence of the maximum capillary pressure limits the amount of liquid that can be pulled from the relatively cold or cool area of the vapor chamber 112 to the area of the vapor chamber 112 over the heat sources 108*a* and 108*b*. The power at which the rate of vaporization matches this maximum liquid flow rate is defined as Qmax for the vapor chamber 112. By adjusting the polarity of the adjustable polarized layer 114*a* to control the flow of the ionized fluid 120, the vapor chamber can sustain a high-power burst at powers greater than the Qmax of the vapor chamber 112 without drying out during the burst period.

Figure 4:
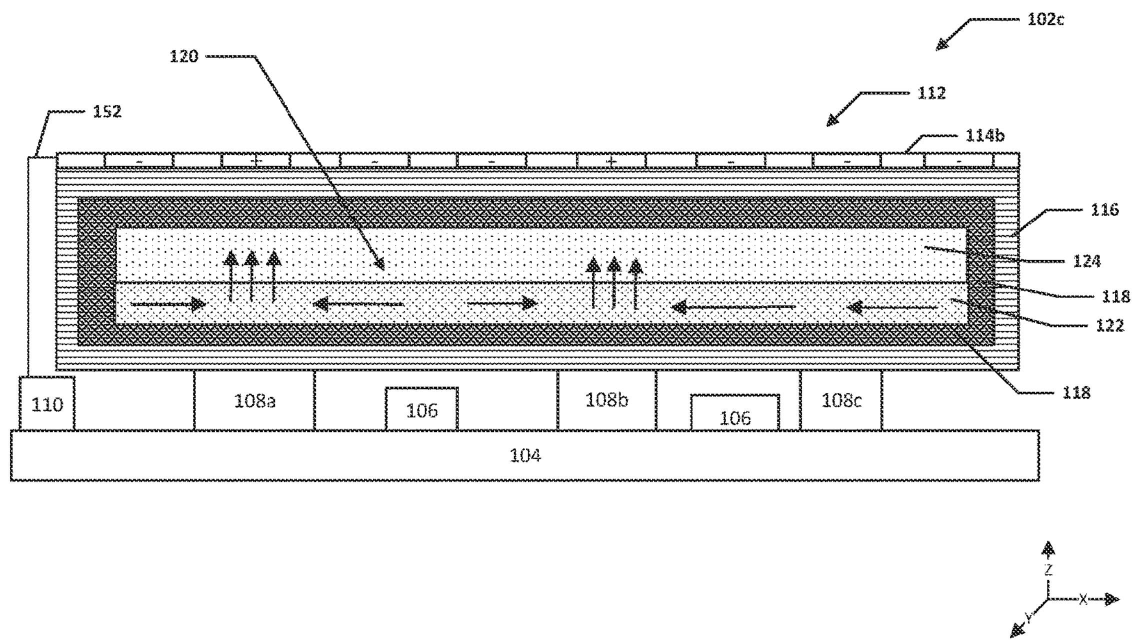
FIG. 4 is a simplified block diagram of a partial side view of a system to enable a vapor chamber with ionized fluid, in accordance with an embodiment of the present disclosure.

Turning to FIG. 4, FIG. 4 is a simplified block diagram of a portion of an electronic device 102*c*, in accordance with an embodiment of the present disclosure. In an example, the electronic device 102*c* can include the support structure 104 and the polarizing engine 110. The electronic components 106 and the one or more heat sources 108 can be over the support structure 104.

The vapor chamber 112 can be over the heat sources 108*a*-108*c*. The vapor chamber 112 can include the outside wall 116, the wick material 118, and the ionized fluid 120. The ionized fluid 120 is the working fluid of the vapor chamber 112 and can be in a liquid form as the ionized liquid 122 or in a vapor form as the ionized vapor 124. An adjustable polarized layer 114*b* can be over the vapor chamber 112. The adjustable polarized layer 114*b* can be coupled to the polarizing engine 110 using a communication path 152. In an example, the adjustable polarized layer 114*b* can have a thickness between about 0.1 millimeters and about 0.5 millimeters and ranges therein (e.g., between about 0.15 and about 0.3 millimeters, or between about 0.2 and about 0.4 millimeters), depending on design choice and design constraints. In other examples, the adjustable polarized layer 114*b* can have a thickness depending on design choice and design constraints. In a specific example, the adjustable polarized layer 114*b* can have a thickness that is less than or equal to about 0.3 millimeters. In another specific example, the adjustable polarized layer 114*b* can have a thickness that is greater than or equal to about 0.1 millimeters. In another specific example, the adjustable polarized layer 114*b* can have a thickness that is about 0.2 millimeters.

The adjustable polarized layer 114*b* can be secured to a top surface of the outside wall 116 of the vapor chamber 112. Using the communication path 152, the polarizing engine 110 can control what areas of the adjustable polarized layer 114*b* are biased positive and what areas of the adjustable polarized layer 114*b* are biased negative. For example, as illustrated in FIG. 4, the polarizing engine 110 can cause an area of the adjustable polarized layer 114*b* over the heat sources 108*a* and 108*b* to be biased positive while other areas of the adjustable polarized layer 114*b* are biased negative. The positive areas of the adjustable polarized layer 114*b* attract or pull the ionized vapor 124 in the vapor chamber 112 and the negative areas of the adjustable polarized layer 114*b* repel or push the ionized vapor 124 in the vapor chamber 112. By causing the ionized vapor 124 in the vapor chamber 112 to flow towards the heat sources 108*a* and 108*b*, the time to dry out of the vapor chamber 112 can be increased and/or if the heat source is a processor, the amount of time that can be spent using an increased clock frequency of the processor can be increased.

More specifically, the vapor chamber 112 is filled with the ionized liquid 122 and the ionized vapor 124. Heat from the heat sources 108*a*-108*c* causes the ionized liquid 122 to vaporize into the ionized vapor 124. The ionized vapor 124 travels to the relatively cold or cool portion of the vapor chamber 112 and condenses into the ionized liquid 122 and releases the heat collected from the heat sources 108*a*-108*c*. The capillary force in the wick material 118 pulls the ionized liquid 122 back to the portion of the vapor chamber 112 over the heat sources 108*a*-108*c*, thus completing the vapor/liquid flow loop. There is a maximum capillary pressure the wick material 118 can provide, defined by its porous structure. The presence of the maximum capillary pressure limits the amount of liquid that can be pulled from the relatively cold or cool area of the vapor chamber 112 to the area of the vapor chamber 112 over the heat sources 108*a* and 108*b*. The power at which the rate of vaporization matches this maximum liquid flow rate is defined as Qmax for the vapor chamber 112. By adjusting the polarity of the adjustable polarized layer 114*b* to control the flow of the ionized vapor 124, the vapor chamber 112 can sustain a high-power burst at powers greater than the Qmax of the vapor chamber 112 without drying out during the burst period. Note that securing the adjustable polarized layer 114*b* to the top surface of the outside wall 116 of the vapor chamber 112, as illustrated in FIG. 4 would not be as efficient in controlling the flow of the ionized fluid 120 as securing the adjustable polarized layer 114 to the bottom outside wall 116 of the vapor chamber 112 as illustrated in FIGS. 2A and 2B or as efficient as securing the adjustable polarized layer 114*a* to the bottom and side of the outside wall 116 of the vapor chamber 112 as illustrated in FIG. 3. In an example, a vapor chamber can include an adjustable polarized layer on the top, bottom, and one or more sides of the vapor chamber.

Figure 5A:
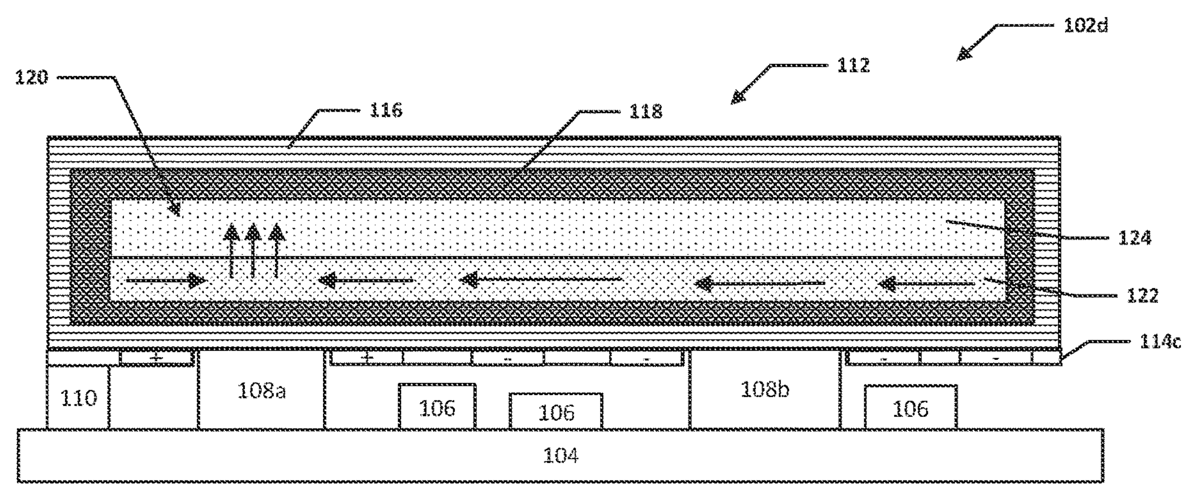
FIGS. 5A and 5B are a simplified block diagram of a partial side view of a system to enable a vapor chamber with ionized fluid, in accordance with an embodiment of the present disclosure.

Turning to FIG. 5A, FIG. 5A is a simplified block diagram of a portion of the electronic device 102*d*, in accordance with an embodiment of the present disclosure. In an example, the electronic device 102*d* can include the support structure 104. The electronic components 106, the one or more heat sources 108, and the polarizing engine 110 can be over the support structure 104. For example, FIG. 5A illustrates the heat sources 108*a* and 108*b* are over the support structure 104.

The vapor chamber 112 can be over the heat sources 108*a* and 108*b*. The vapor chamber 112 can include the outside wall 116, the wick material 118, and the ionized fluid 120. The ionized fluid 120 is the working fluid of the vapor chamber 112 and can be in a liquid form as the ionized liquid 122 or in a vapor form as the ionized vapor 124. An adjustable polarized layer 114*c* can be secured to a portion of the bottom outside wall 116 of the vapor chamber 112. For example, as illustrated in FIG. 5A, the adjustable polarized layer 114*c* extends along the bottom outside wall 116 of the vapor chamber 112 between the heat sources 108*a* and 108*b* in the areas the bottom outside wall 116 of the vapor chamber that are not above the heat sources 108*a* and 108*b*. In an example, the adjustable polarized layer 114*c* can have a thickness between about 0.1 millimeters and about 0.5 millimeters and ranges therein (e.g., between about 0.15 and about 0.3 millimeters, or between about 0.2 and about 0.4 millimeters), depending on design choice and design constraints. In other examples, the adjustable polarized layer 114*c* can have a thickness depending on design choice and design constraints. In a specific example, the adjustable polarized layer 114*c* can have a thickness that is less than or equal to about 0.3 millimeters. In another specific example, the adjustable polarized layer 114*c* can have a thickness that is greater than or equal to about 0.1 millimeters. In another specific example, the adjustable polarized layer 114*c* can have a thickness that is about 0.2 millimeters.

The polarizing engine 110 can control what areas of the adjustable polarized layer 114*c* are biased positive and what areas of the adjustable polarized layer 114*c* are biased negative. For example, as illustrated in FIG. 5A, the polarizing engine 110 can cause an area of the adjustable polarized layer 114*c* over the heat source 108*a* to be biased positive while other areas of the adjustable polarized layer 114*c* are biased negative. The positive areas of the adjustable polarized layer 114*c* attract or pull the ionized liquid 122 in the vapor chamber 112 towards the heat source 108*a* and the negative areas of the adjustable polarized layer 114*c* repel or push the ionized liquid 122 in the vapor chamber 112 towards the heat source 108*a*. By causing the ionized liquid 122 in the vapor chamber 112 to flow towards the heat source 108*a*, the time to dry out of the vapor chamber 112 can be increased and/or if the heat source is a processor, the amount of time that can be spent using an increased clock frequency of the processor can be increased.

More specifically, the vapor chamber 112 is filled with the ionized liquid 122 and the ionized vapor 124. Heat from the heat sources 108*a* and 108*b* cause the ionized liquid 122 to vaporize into the ionized vapor 124. The ionized vapor 124 travels to the relatively cold or cool area of the vapor chamber 112 and condenses into the ionized liquid 122 and releases the heat collected from the heat sources 108*a* and 108*b*. The capillary force in the wick material 118 pulls the ionized liquid 122 back to the portion of the vapor chamber 112 over the heat sources 108*a* and 108*b*, thus completing the vapor/liquid flow loop. There is a maximum capillary pressure the wick material 118 can provide, defined by its porous structure. The presence of the maximum capillary pressure limits the amount of liquid that can be pulled from the relatively cold or cool area of the vapor chamber 112 to the area of the vapor chamber 112 over the heat source 108*a*. The power at which the rate of vaporization matches this maximum liquid flow rate is defined as Qmax for the vapor chamber 112. By adjusting the polarity of the adjustable polarized layer 114*c* to control the flow of the ionized fluid 120, the vapor chamber can sustain a high-power burst at powers greater than the Qmax of the vapor chamber 112 without drying out during the burst period.

Figure 5B:
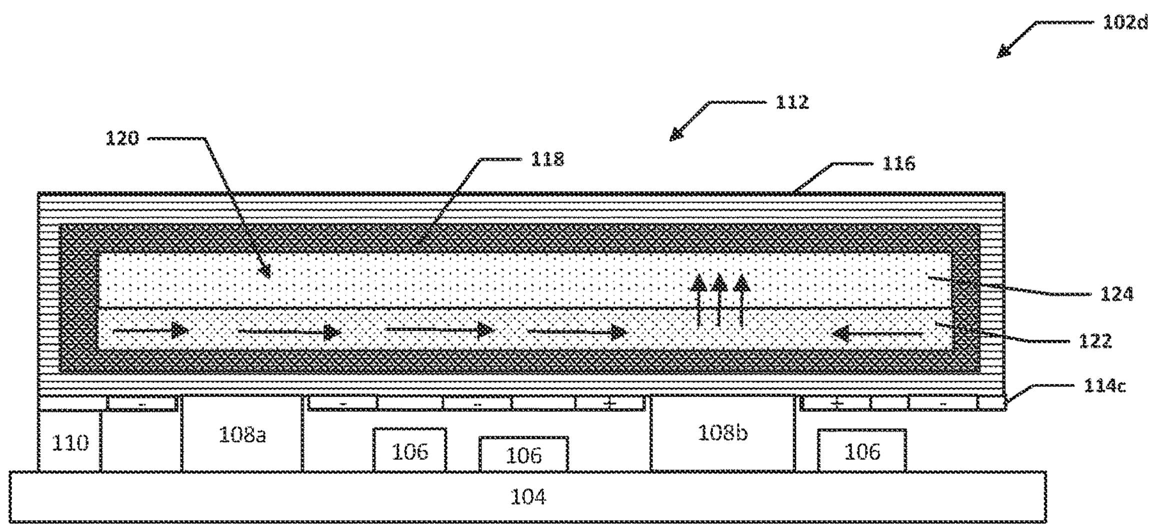

Turning to FIG. 5B, FIG. 5B is a simplified block diagram of a portion of the electronic device 102*d*, in accordance with an embodiment of the present disclosure. In an example, the electronic device 102*d* can include the support structure 104. The electronic components 106, the one or more heat sources 108, and the polarizing engine 110 can be over the support structure 104.

The vapor chamber 112 can be over the heat sources 108*a* and 108*b*. The vapor chamber 112 can include the outside wall 116, the wick material 118, and the ionized fluid 120. The ionized fluid 120 is the working fluid of the vapor chamber 112 and can be in a liquid form as the ionized liquid 122 or in a vapor form the ionized vapor 124.

The adjustable polarized layer 114*c* can be secured to a portion of the bottom outside wall 116 of the vapor chamber 112. For example, as illustrated in FIG. 5B, the adjustable polarized layer 114*c* extends along the bottom outside wall 116 of the vapor chamber between the heat sources 108*a* and 108*b* in the areas the bottom outside wall 116 of the vapor chamber that are not above the heat sources 108*a* and 108*b*. The polarizing engine 110 can control what areas of the adjustable polarized layer 114*c* are biased positive and what areas of the adjustable polarized layer 114*c* are biased negative. For example, as illustrated in FIG. 5B, the polarizing engine 110 can cause an area of the adjustable polarized layer 114*c* over the heat source 108*b* to be biased positive while other areas of the adjustable polarized layer 114*c* are biased negative. The positive areas of the adjustable polarized layer 114*c* attract or pull the ionized liquid 122 in the vapor chamber 112 towards the heat source 108*b* and the negative areas of the adjustable polarized layer 114*c* repel or push the ionized liquid 122 in the vapor chamber 112 towards the heat source 108*b*. By causing the ionized liquid 122 in the vapor chamber 112 to flow towards the heat source 108*b*, the time to dry out of the vapor chamber 112 can be increased and/or if the heat source is a processor, the amount of time that can be spent using an increased clock frequency of the processor can be increased.

More specifically, the vapor chamber 112 is filled with the ionized liquid 122 and the ionized vapor 124. Heat from the heat sources 108*a* and 108*b* cause the ionized liquid 122 to vaporize into the ionized vapor 124. The ionized vapor 124 travels to the cold or cool portion of the vapor chamber 112 and condenses into the ionized liquid 122 and releases the heat collected from the heat sources 108*a* and 108*b*. The capillary force in the wick material 118 pulls the ionized liquid 122 back to the portion of the vapor chamber 112 over the heat sources 108*a* and 108*b*, thus completing the vapor/liquid flow loop. There is a maximum capillary pressure the wick material 118 can provide, defined by its porous structure. The presence of the maximum capillary pressure limits the amount of liquid that can be pulled from the cold or cool area of the vapor chamber 112 to the area of the vapor chamber 112 over the heat source 108*b*. The power at which the rate of vaporization matches this maximum liquid flow rate is defined as Qmax for the vapor chamber 112. By adjusting the polarity of the adjustable polarized layer 114*c* to control the flow of the ionized fluid 120, the vapor chamber can sustain a high-power burst at powers greater than the Qmax of the vapor chamber 112 without drying out during the burst period.

Figure 6:
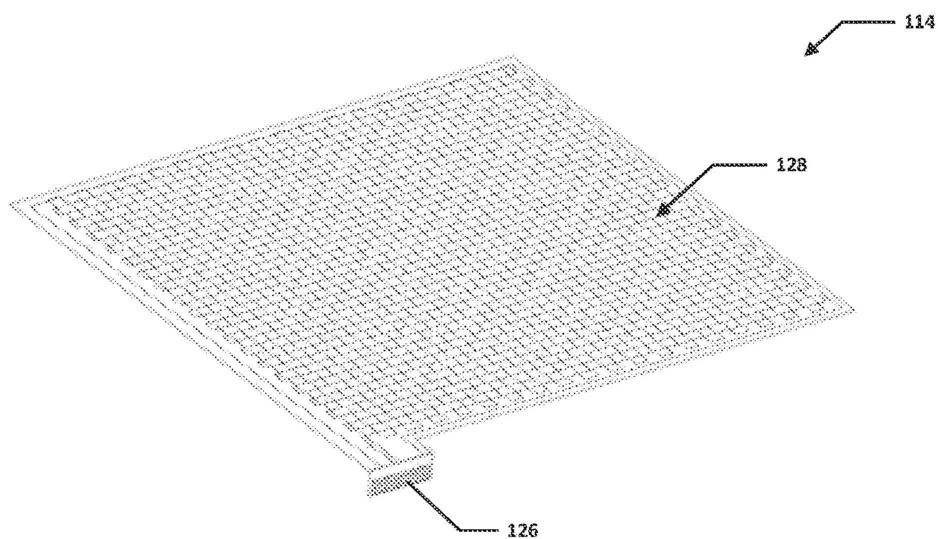
FIG. 6 is a simplified block diagram of a partial view of a system to enable a vapor chamber with ionized fluid, in accordance with an embodiment of the present disclosure.

Turning to FIG. 6, FIG. 6 is a simplified block diagram of a portion of the adjustable polarized layer 114. In an example, the adjustable polarized layer 114 can include a polarizing engine interface 126 and array of electrode stripes 128. The polarizing engine interface 126 can be coupled to the polarizing engine 110 (not shown) to allow the polarizing engine 110 to control the bias of one or more portions of the array of electrode stripes 128. For example, the array of electrode stripes 128 can be used to by the polarizing engine 110 to create the positive areas of the adjustable polarized layer 114 that attract or pull ionized liquid (e.g., the ionized liquid 122) in a vapor chamber (e.g., the vapor chamber 112) towards heat sources (e.g., heat sources 108*a* and 108*b*) and the negative areas of the adjustable polarized layer 114 to repel or push the ionized liquid in the vapor chamber. The electrodes stripes 128 can be tied to adjustable low/high voltages/bias according to different cooling needs per varied workloads. In some examples, a grid or array of electrodes (e.g., the array of electrode stripes 128) can be used to help direct the flow of the ionized fluid. In other examples, concentric circles of electrodes can be used to help direct the flow of the ionized fluid. The concentric circles of electrodes can be driven by a circuit that energized them in sequence from outside to inside, pushing the ionized fluid towards the heat source.

Figure 7:
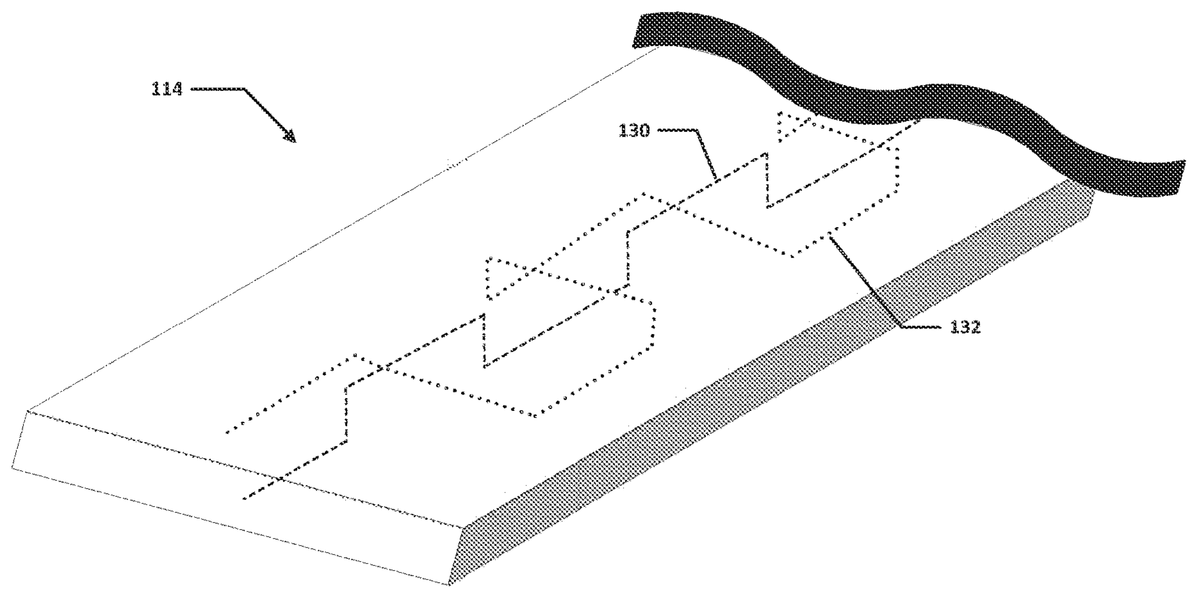
FIG. 7 is a simplified block diagram of a partial side view of a system to enable a vapor chamber with ionized fluid, in accordance with an embodiment of the present disclosure.

Turning to FIG. 7, FIG. 7 is a simplified block diagram of a portion of the adjustable polarized layer 114. In an example, the adjustable polarized layer 114 can include an array of positive electrode stripes 130 and an array of negative electrode stripes 132. The array of positive electrode stripes 130 and the array of negative electrode stripes 132 can be used to by the polarizing engine 110 (not shown) to create the positive areas of the adjustable polarized layer 114 that attract or pull ionized liquid 122 (e.g., the ionized liquid) in a vapor chamber (e.g., the vapor chamber 112) towards heat sources (e.g., heat sources 108*a* and 108*b*) and the negative areas of the adjustable polarized layer 114 to repel or push the ionized liquid in the vapor chamber.

In an example, the electrode stripes would not activate when the system is fully loaded with a maximum or near maximum workload to avoid confronting with the incoming evaporated vapor. After the workload ends, the system can detect the end of the workload, activate the electrode stripes, and accelerate the water recirculation by pushing the ionized liquid water towards to the one or more heat sources. After a few rounds of recirculating and forced convection inside the vapor chamber, the vapor chamber can be recharged and ready for a second round of an increased workload.

In an illustrative example, to determine the amount of acceleration of the water, a voltage source is 3.3 V with a current applied at 1 mA for 1 msec. The power consumed is 3.3 mW and a charge of 1 microcoulomb is introduced. Using the equation $F=(k*Q_1*Q_2)/d^2$ where "$Q_1$" represents the quantity of charge on object 1 (in Coulombs), "$Q_2$" represents the quantity of charge on object 2 (in Coulombs), and "d" represents the distance of separation between the two objects (in meters). In the above equation, the "k" is a proportionality constant known as the Coulomb's law constant. In the specific example of water, the value of "k" is approximately 108 N·m2/C2. The distance between the anode (object 1) and the cathode (object 2) can be designed as 1 cm. The force produced, F=(108×10−6×10−6)/(10−2 m×10−2 m)=1 N.

The acceleration can be determined using F=m×a where "F" represents the force (Newton) created, "m" represents the mass of the thermal liquid, and "a" represents the acceleration created in the thermal liquid (in meters/second2). The resultant acceleration, a=1 N/1 g=1 meters/second2. The accelerated ionized fluid can help to speed up the thermal conductivity, resulting in better thermal performance of the system.

Figure 8:
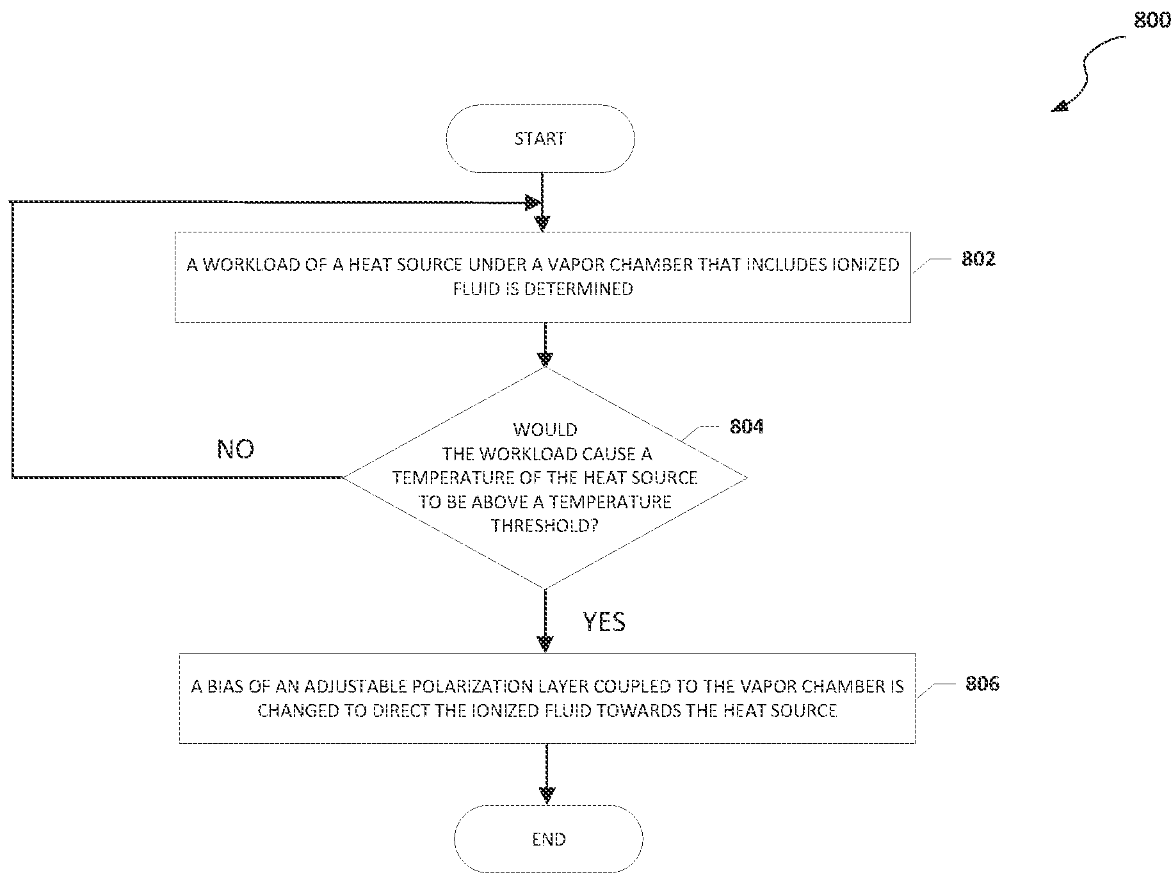
FIG. 8 is a simplified flowchart illustrating potential operations that may be associated with the system in accordance with an embodiment of the present disclosure.

Turning to FIG. 8, FIG. 8 is an example flowchart illustrating possible operations of a flow 800 that may be associated with a vapor chamber that includes ionized fluid, in accordance with an embodiment. In an embodiment, one or more operations of flow 800 may be performed by the polarizing engine 110. At 802, a workload of a heat source under a vapor chamber that includes ionized fluid is determined. At 804, the system determines if the workload would cause a temperature of the heat source to be above a temperature threshold. In an example, the temperature threshold can be above a maximum operating temperature set by a manufacture of the heat source or above some other predetermined temperature (e.g., about 75% of the maximum operating temperature set by the manufacture). If the workload would not cause the temperature of the heat source to be above the temperature threshold, then the system returns to 802 and again determines a workload of the heat source. The workload can be a new workload for the heat source or the same workload but at a different point in time. If the workload would cause the temperature of the heat source to be above the temperature threshold, then a bias of an adjustable polarization layer coupled to the vapor chamber is changed to direct the ionized fluid in the vapor chamber towards the heat source, as in 806. For example, the polarizing engine 110 can determine a workflow for the heat source 108*a* illustrated in FIG. 2A and determine that the workflow would cause the temperature of the heat source to be above the temperature threshold or the polarizing engine 110 can receive an indication (e.g., from the workload engine 154) related to the workflow for the heat source 108*a* and determine that the workflow would cause the temperature of the heat source to be above the temperature threshold. The polarizing engine 110 can change the bias of the adjustable polarization layer 114 coupled to the vapor chamber 112 to direct the ionized fluid 120 towards the heat source 108*a*, as illustrated in FIG. 2A.

Figure 9:
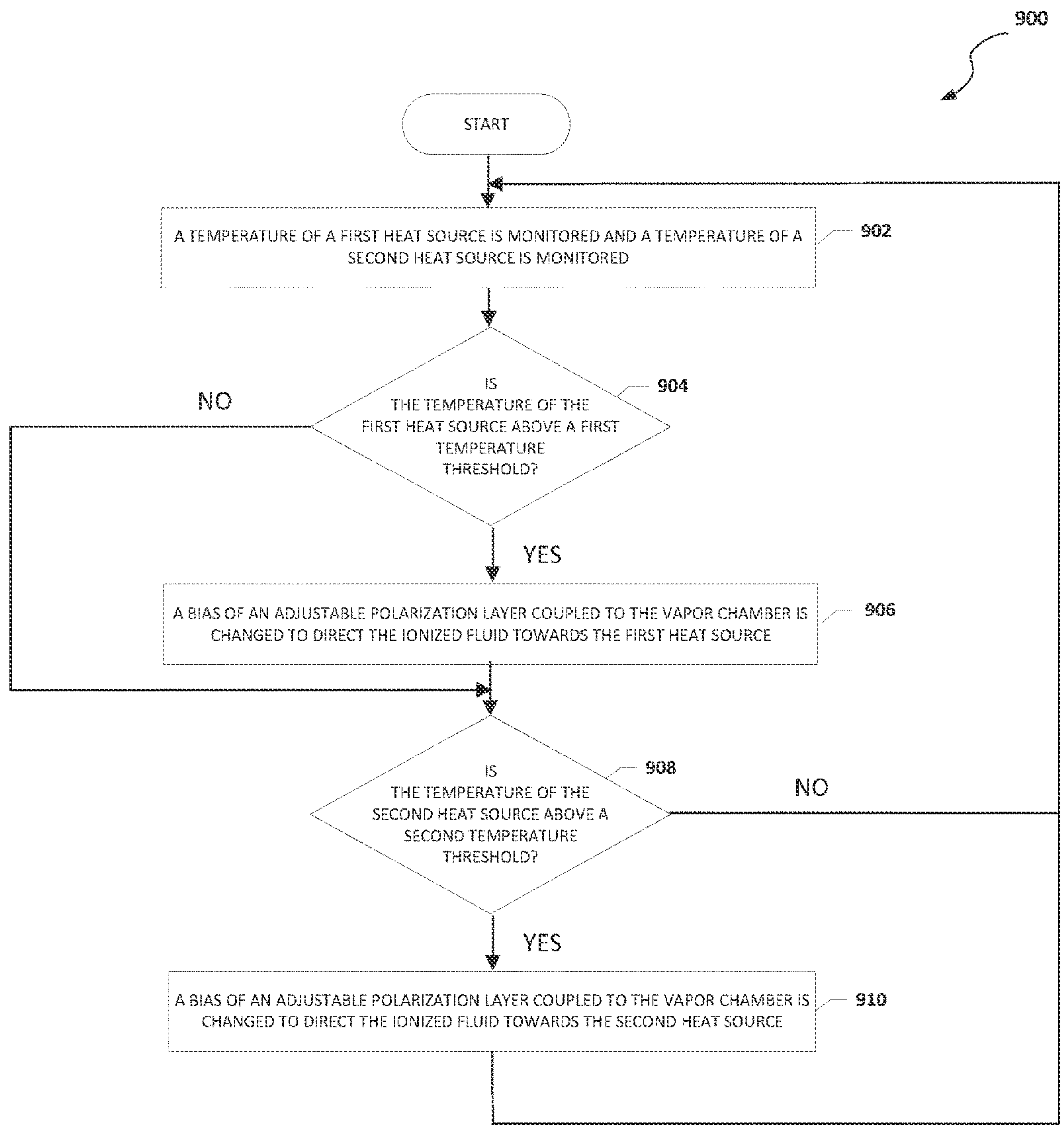
FIG. 9 is a simplified flowchart illustrating potential operations that may be associated with the system in accordance with an embodiment of the present disclosure.

Turning to FIG. 9, FIG. 9 is an example flowchart illustrating possible operations of a flow 900 that may be associated with a vapor chamber that includes ionized fluid, in accordance with an embodiment. In an embodiment, one or more operations of flow 900 may be performed by the polarizing engine 110. At 902, a temperature of a first heat source is monitored and a temperature of a second heat source is monitored. At 904, the system determines if the temperature of the first heat source is above a first temperature threshold. In an example, the first temperature threshold can be above a maximum operating temperature set by a manufacture of the first heat source or above some other predetermined temperature (e.g., about 75% of the maximum operating temperature set by the manufacture). If the temperature of the first heat source is not above the first temperature threshold, then the system determines if the temperature of the second heat source is above a second temperature threshold, as in 908. In an example, the second temperature threshold can be above a maximum operating temperature set by a manufacture of the second heat source or above some other predetermined temperature (e.g., about 75% of the maximum operating temperature set by the manufacture). If the temperature of the first heat source is above the first temperature threshold, then a bias of an adjustable polarization layer coupled to a vapor chamber over the first heat source is changed to direct the ionized fluid towards the first heat source, as in 906. At 908, the system determines if the temperature of the second heat source is above a second temperature threshold. If the temperature of the second heat source is not above the second temperature threshold, then the system returns to 902 and the temperature of the first heat source is monitored and the temperature of the second heat source is monitored. If the temperature of the second heat source is above the second temperature threshold, then a bias of the adjustable polarization layer coupled to the vapor chamber over the second heat source is changed to direct the ionized fluid towards the second heat source, as in 910.

Figure 10:
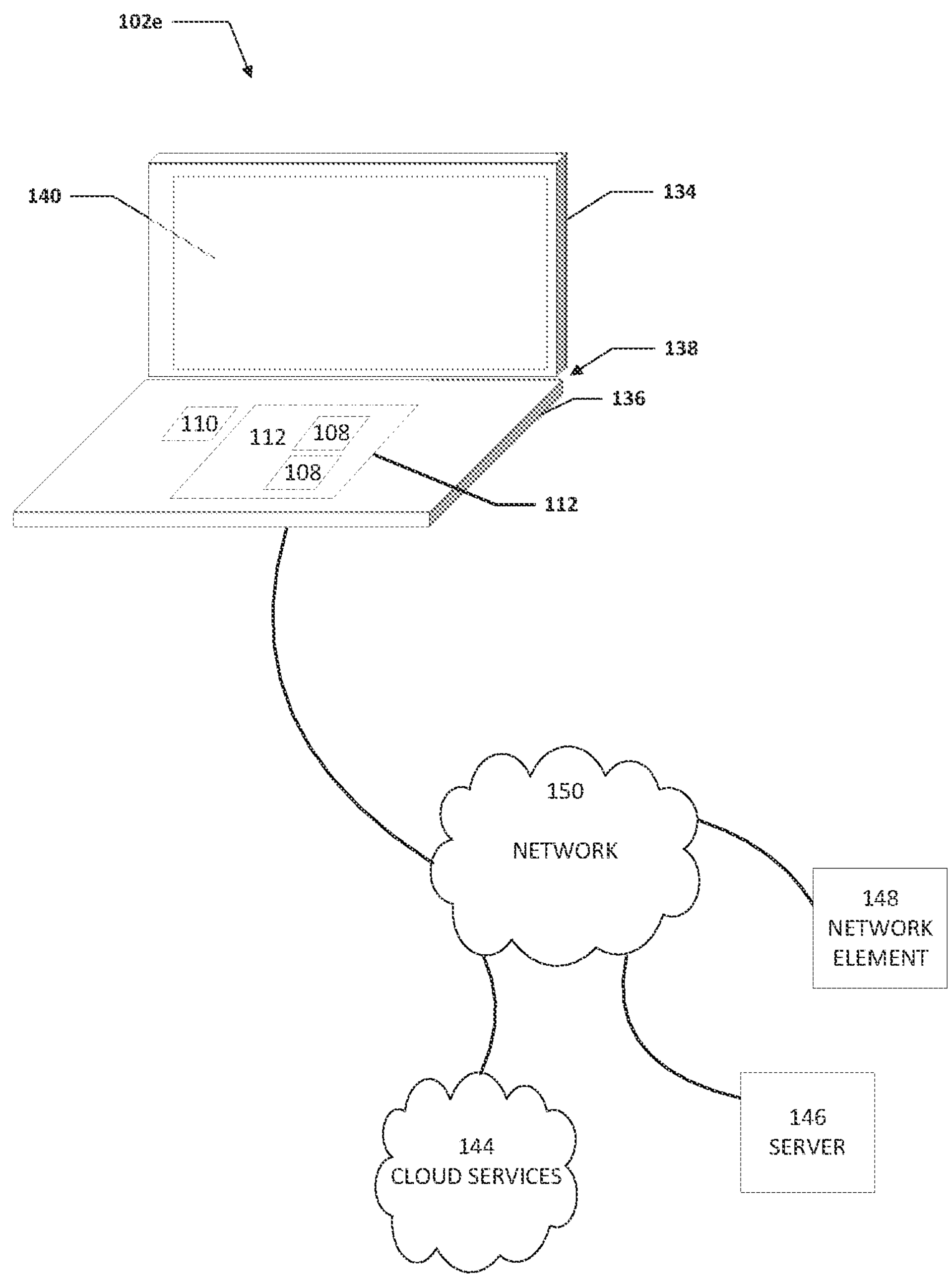
FIG. 10 is a simplified block diagram of an electronic device that includes a vapor chamber with ionized fluid, in accordance with an embodiment of the present disclosure.

Turning to FIG. 10, FIG. 10 is a simplified block diagram of an electronic device 102*a* configured with a vapor chamber that includes ionized fluid, in accordance with an embodiment of the present disclosure. In an example, the electronic device 102*e* can include a first housing 134 and a second housing 136. The first housing 134 and the second housing 136 can be rotatably or pivotably coupled together using a hinge 138. The first housing 134 can include a display 140. The second housing 136 can include a keyboard (not shown or referenced) the heat sources 108, the polarizing engine 110, and the vapor chamber 112. The vapor chamber 112 can include the ionized fluid 120 (not shown or referenced).

Each of one or more heat sources 108 may be a heat generating device (e.g., processor, logic unit, field programmable gate array (FPGA), chip set, integrated circuit (IC), a graphics processor, graphics card, battery, memory, or some other type of heat generating device). Implementations of the embodiments disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

The electronic device 102*e* (and the electronic devices 102 and 102*a*-102*d*) may be in communication with cloud services 144, one or more servers 146, and/or one or more network elements 148 using a network 150. In some examples, the electronic device 102*e* (and the electronic devices 102 and 102*a*-102*d*) may be standalone devices and not connected to the network 150 or another device Elements of FIG. 10 may be coupled to one another through one or more interfaces employing any suitable connections (wired or wireless), which provide viable pathways for network (e.g., the network 150, etc.) communications. Additionally, any one or more of these elements of FIG. 10 may be combined or removed from the architecture based on particular configuration needs. The network 150 may include a configuration capable of transmission control protocol/Internet protocol (TCP/IP) communications for the transmission or reception of packets in a network. The electronic device 102*e* (and the electronic devices 102 and 102*a*-102*d*) may also operate in conjunction with a user datagram protocol/IP (UDP/IP) or any other suitable protocol where appropriate and based on particular needs.

Turning to the infrastructure of FIG. 10, the network 150 represents a series of points or nodes of interconnected communication paths for receiving and transmitting packets of information. The network 150 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In the network 150, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although the electronic devices 102 and 102*a*-102*e* have been illustrated with reference to particular elements and operations, these elements and operations may be replaced by any suitable architecture, protocols, and/or processes that achieve the intended functionality of the electronic devices 102 and 102*a*-102*e*.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, an electronic device can include a vapor chamber that includes ionized fluid and an adjustable polarization layer coupled to the vapor chamber. The adjustable polarization layer can direct a flow of the ionized fluid in the vapor chamber.

In Example A2, the subject matter of Example A1 can optionally include where the ionized fluid is ionized water.

In Example A3, the subject matter of any one of Examples A1-A2 can optionally include where the adjustable polarization layer is a polyester (PET) film that includes a plurality of electrode stripes.

In Example A4, the subject matter of any one of Examples A1-A3 can optionally include where the PET film has a thickness equal to or less than about 0.2 millimeters.

In Example A5, the subject matter of any one of Examples A1-A4 can optionally include a first heat source and a second heat source under the vapor chamber, where the adjustable polarization layer is between the vapor chamber and the first heat source and the second heat source.

In Example A6, the subject matter of any one of Examples A1-A5 can optionally include where the adjustable polarization layer is biased to direct the flow of the ionized fluid in the vapor chamber to the first heat source.

In Example A7, the subject matter of any one of Examples A1-A6 can optionally include where the adjustable polarization layer is located on a bottom portion of the vapor chamber and at least a portion of one or more sides of the vapor chamber.

Example AA1 is a device including one or more heat sources, a vapor chamber over the one or more heat sources, where the vapor chamber includes ionized fluid, an adjustable polarization layer coupled to the vapor chamber and between the vapor chamber and the one or more heat sources, where the adjustable polarization layer includes an array of electrodes that can be used to direct a flow of the ionized fluid in the vapor chamber, and a polarizing engine to positively bias one or more first portions of the adjustable polarization layer and to negatively bias one or more second portions of the adjustable polarization layer.

In Example AA2, the subject matter of Example AA1 can optionally include where the ionized fluid is ionized water.

In Example AA3, the subject matter of any one of Examples AA1-AA2 can optionally include where at least a portion of the positively biased one or more first portions of the adjustable polarization layer is over a first heat source from the one or more heat sources and at least a portion of the negatively biased one or more second portions of the adjustable polarization layer is over a second heat source from the one or more heat sources.

In Example AA4, the subject matter of any one of Examples AA1-AA3 can optionally include where the polarizing engine causes at least a portion of the positively biased one or more first portions of the adjustable polarization layer over the first heat source to change to a negative bias and causes at least a portion of the negatively biased one or more second portions of the adjustable polarization layer over the second heat source to change to a positive bias.

In Example AA5, the subject matter of any one of Examples AA1-AA4 can optionally include where the adjustable polarization layer has a thickness equal to or less than about 0.2 millimeters.

In Example AA6, the subject matter of any one of Examples AA1-AA5 can optionally include where the adjustable polarization layer is a polyester (PET) film that includes a plurality of electrode stripes.

In Example AA7, the subject matter of any one of Examples AA1-AA6 can optionally include where the PET film has a thickness between about 0.1 millimeters and about 0.5 millimeters.

Example M1 is a method including determining a workload of a heat source under a vapor chamber that includes an ionized fluid and changing a bias of an adjustable polarization layer coupled to the vapor chamber when the workload of the heat source causes or will cause the heat source to be above a temperature threshold, where the adjustable polarization layer is used to direct a flow of the ionized fluid in the vapor chamber towards the heat source.

In Example M2, the subject matter of Example M1 can optionally include determining a second workload of a second heat source under the vapor chamber and changing the bias of at least a portion of the adjustable polarization layer when the second workload of the second heat source causes or will cause the second heat source to be above a second temperature threshold, where the adjustable polarization layer is used to direct the flow of the ionized fluid in the vapor chamber towards the second heat source.

In Example M3, the subject matter of any one of the Examples M1-M2 can optionally include where the ionized fluid is ionized water.

In Example M4, the subject matter of any one of the Examples M1-M3 can optionally include where the adjustable polarization layer is an array of electrode stripes.

In Example M5, the subject matter of any one of the Examples M1-M4 can optionally include where the adjustable polarization layer is a polyester (PET) film that includes a plurality of electrode stripes.

In Example, M6, the subject matter of any one of the Examples M1-M5 can optionally include where the PET film has a thickness between about 0.1 millimeters and about 0.5 millimeters.

Example AAA1 is a device including means for determining a workload of a heat source under a vapor chamber that includes an ionized fluid and means for changing a bias of an adjustable polarization layer coupled to the vapor chamber when the workload of the heat source causes or will cause the heat source to be above a temperature threshold, where the adjustable polarization layer is used to direct a flow of the ionized fluid in the vapor chamber towards the heat source.

In Example AAA2, the subject matter of Example AAA1 can optionally include means for determining a second workload of a second heat source under the vapor chamber and means for changing the bias of at least a portion the adjustable polarization layer when the second workload of the second heat source causes or will cause the second heat source to be above a second temperature threshold, where the adjustable polarization layer is used to direct the flow of the ionized fluid in the vapor chamber towards the second heat source.

In Example AAA3, the subject matter of any one of Examples AAA1-AAA2 can optionally include where the ionized fluid is ionized water.

In Example AAA4, the subject matter of any one of Examples AAA1-AAA3 can optionally include where the adjustable polarization layer is an array of electrode stripes.

In Example AAA5, the subject matter of any one of Examples AAA1-AAA4 can optionally include where the adjustable polarization layer is a polyester (PET) film that includes a plurality of electrode stripes.

In Example AAA6, the subject matter of any one of Examples AAA1-AAA5 can optionally include where the PET film has a thickness between about 0.1 millimeters and about 0.5 millimeters.

What is claimed is:

1. An electronic device comprising:

a vapor chamber that includes ionized fluid; and an adjustable polarization layer coupled to the vapor chamber, wherein the adjustable polarization layer can direct a flow of the ionized fluid in the vapor chamber.

2. The electronic device of claim 1, wherein the ionized fluid is ionized water.

3. The electronic device of claim 1, wherein the adjustable polarization layer is a polyester (PET) film that includes a plurality of electrode stripes.

4. The electronic device of claim 3, wherein the PET film has a thickness equal to or less than about 0.2 millimeters.

5. The electronic device of claim 1, further comprising:

a first heat source and a second heat source under the vapor chamber, wherein the adjustable polarization layer is between the vapor chamber and the first heat source and the second heat source.

6. The electronic device of claim 5, wherein the adjustable polarization layer is biased to direct the flow of the ionized fluid in the vapor chamber to the first heat source.

7. The electronic device of claim 1, wherein the adjustable polarization layer is located on a bottom portion of the vapor chamber and at least a portion of one or more sides of the vapor chamber.

8. A device comprising:

one or more heat sources;

a vapor chamber over the one or more heat sources, wherein the vapor chamber includes ionized fluid;

an adjustable polarization layer coupled to the vapor chamber and between the vapor chamber and the one or more heat sources, wherein the adjustable polarization layer includes an array of electrodes that can be used to direct a flow of the ionized fluid in the vapor chamber; and a polarizing engine to positively bias one or more first portions of the adjustable polarization layer and to negatively bias one or more second portions of the adjustable polarization layer.

9. The device of claim 8, wherein the ionized fluid is ionized water.

10. The device of claim 8, wherein at least a portion of the positively biased one or more first portions of the adjustable polarization layer is over a first heat source from the one or more heat sources and at least a portion of the negatively biased one or more second portions of the adjustable polarization layer is over a second heat source from the one or more heat sources.

11. The device of claim 10, wherein the polarizing engine causes at least a portion of the positively biased one or more first portions of the adjustable polarization layer over the first heat source to change to a negative bias and causes at least a portion of the negatively biased one or more second portions of the adjustable polarization layer over the second heat source to change to a positive bias.

12. The device of claim 8, wherein the adjustable polarization layer has a thickness equal to or less than about 0.2 millimeters.

13. The device of claim 8, wherein the adjustable polarization layer is a polyester (PET) film that includes a plurality of electrode stripes.

14. The device of claim 13, wherein the PET film has a thickness between about 0.1 millimeters and about 0.5 millimeters.

15. A method comprising:

determining a workload of a heat source under a vapor chamber that includes an ionized fluid; and changing a bias of an adjustable polarization layer coupled to the vapor chamber when the workload of the heat source causes or will cause the heat source to be above a temperature threshold, wherein the adjustable polarization layer is used to direct a flow of the ionized fluid in the vapor chamber towards the heat source.

16. The method of claim 15, further comprising:

determining a second workload of a second heat source under the vapor chamber; and changing the bias of at least a portion the adjustable polarization layer when the second workload of the second heat source causes or will cause the second heat source to be above a second temperature threshold, wherein the adjustable polarization layer is used to direct the flow of the ionized fluid in the vapor chamber towards the second heat source.

17. The method of claim 15, wherein the ionized fluid is ionized water.

18. The method of claim 15, wherein the adjustable polarization layer is an array of electrode stripes.

19. The method of claim 15, wherein the adjustable polarization layer is a polyester (PET) film that includes a plurality of electrode stripes.

20. The method of claim 19, wherein the PET film has a thickness between about 0.1 millimeters and about 0.5 millimeters.

* * * * *